US012610821B2

(12) United States Patent
Song et al.

(10) Patent No.: US 12,610,821 B2
(45) Date of Patent: Apr. 21, 2026

(54) CHIP APPARATUS AND ELECTRONIC DEVICE

(71) Applicant: Huawei Technologies Co., Ltd., Shenzhen (CN)

(72) Inventors: Guidong Song, Shenzhen (CN); Yiwei Fan, Dongguan (CN)

(73) Assignee: HUAWEI TECHNOLGOIES CO., LTD., Shenzhen (CN)

( * ) Notice: Subject to any disclaimer, the term of this patent is extended or adjusted under 35 U.S.C. 154(b) by 1188 days.

(21) Appl. No.: 17/360,594

(22) Filed: Jun. 28, 2021

(65) Prior Publication Data

US 2021/0327783 A1 Oct. 21, 2021

Related U.S. Application Data

(63) Continuation of application No. PCT/CN2019/109062, filed on Sep. 29, 2019.

(30) Foreign Application Priority Data

Dec. 29, 2018 (CN) .......................... 201822256645.8

(51) Int. Cl.
| | |
|---|---|
| *H01L 23/36* | (2006.01) |
| *G06F 1/185* | (2026.01) |
| *G06F 1/20* | (2006.01) |
| *H01L 23/367* | (2006.01) |
| *H01L 23/40* | (2006.01) |

(52) U.S. Cl.
CPC .......... *H01L 23/4006* (2013.01); *H01L 23/36* (2013.01)

(58) Field of Classification Search
CPC . H01L 23/4006; H01L 23/36; H01L 23/4075; G06F 1/182; G06F 1/185; G06F 1/20
See application file for complete search history.

(56) References Cited

U.S. PATENT DOCUMENTS

| | | | |
|---|---|---|---|
| 10,197,754 B2 * | 2/2019 | Moore | H05K 7/20409 |
| 2007/0004091 A1 | 1/2007 | Tamagawa et al. | |
| 2013/0088836 A1 * | 4/2013 | Kuroda | H01L 23/4338 |
| | | | 361/700 |
| 2015/0092354 A1 * | 4/2015 | Kelty | G06F 1/20 |
| | | | 361/722 |
| 2017/0034951 A1 * | 2/2017 | Wang | H01L 23/4093 |
| 2017/0196121 A1 * | 7/2017 | Trygubova | H05K 1/0201 |

FOREIGN PATENT DOCUMENTS

| | | |
|---|---|---|
| CN | 2443490 Y | 8/2001 |
| CN | 1313637 A | 9/2001 |
| CN | 201820753 U | 5/2011 |
| CN | 102906870 A | 1/2013 |
| CN | 103456699 A | 12/2013 |
| JP | 2000114435 A | 4/2000 |
| JP | 2002280499 A | 9/2002 |
| JP | 2008034474 A | 2/2008 |
| JP | 2009026870 A | 2/2009 |
| WO | 2017116536 A1 | 7/2017 |

* cited by examiner

*Primary Examiner* — Omar F Mojaddedi
(74) *Attorney, Agent, or Firm* — Conley Rose, P.C.

(57) ABSTRACT

A chip apparatus and an electronic device, where the chip apparatus includes a housing and a chip assembly fastened to one side of inside of the housing. The chip apparatus further includes a heat sink disposed on an opposite side of the inside of the housing, and the heat sink is thermally connected to the chip assembly.

20 Claims, 3 Drawing Sheets

CHIP APPARATUS AND ELECTRONIC DEVICE

CROSS-REFERENCE TO RELATED APPLICATIONS

This application is a continuation of International Patent Application No. PCT/CN2019/109062 filed on Sep. 29, 2019, which claims priority to Chinese Patent Application No. 201822256645.8 filed on Dec. 29, 2018. The disclosures of the aforementioned applications are hereby incorporated by reference in their entireties.

TECHNICAL FIELD

This relates to the field of communications technologies, and in particular, to a chip apparatus and an electronic device.

BACKGROUND

As a mainstream interface card in current markets, a graphics processing unit (GPU) card is mainly used to meet public cloud high performance computing (HPC), artificial intelligence (AI), and big data requirements, and meet self-developed intelligent analysis requirements in the field of video cloud.

An existing manner of fixing a heat sink on a GPU card is as follows. Referring to FIG. 1, a chip 20 is sandwiched between a heat sink 30 and a board 10, and the heat sink 30 is fastened to the board 10 by using a screw 11. Tightening the screw 11 when installing the heat sink 30 on the board 10 by using this method causes deformation of the board 10, resulting in static stress on the board 10. In addition, when a chip apparatus in which the heat sink 30 is disposed by using this method is impacted, impact force of the heat sink 30 is transmitted to the board 10 by using the screw 11, so that the board 10 bears relatively large impact force. Therefore, the board 10 bears excessively high stress, which easily causes the chip 20 to fall off.

SUMMARY

This provides a chip apparatus and an electronic device, to mitigate stress impact caused by a heat sink on a chip assembly.

According to a first aspect, this provides a chip apparatus, where the chip apparatus includes a housing and a chip assembly fastened to one side inside the housing, to improve mechanical performance of the chip apparatus. The chip apparatus further includes a heat sink disposed on the other side inside the housing relative to the chip assembly, and the heat sink is thermally connected to the chip assembly, to relieve stress exerted on the chip assembly by impact force generated by the heat sink when the chip apparatus is impacted by a collision, a fall, or the like, improve mechanical performance of the chip apparatus, and mitigate stress impact of the heat sink on the chip assembly.

In the foregoing solution, the heat sink is slidably connected to the housing, and the heat sink is capable of sliding in a direction away from the chip assembly, so that when the chip apparatus is struck by a ground or another object due to a collision, fall, or the like, the heat sink can slide in a direction away from the chip assembly to mitigate impact force imposed, thereby achieving energy absorption and shaking reduction effects.

In a specific implementation of relative sliding between the heat sink and the housing, a guiding assembly is disposed in the housing, and the heat sink is slidably connected to the housing by using the guiding assembly.

There is a plurality of manners of disposing the guiding assembly, including but not limited to the following manners.

The guiding assembly may include a guiding post fixedly disposed in the housing and an elastic member sleeved on the guiding post. The heat sink is slidably assembled on the guiding post, one end of the elastic member presses against the housing, and the other end of the elastic member presses against the heat sink. During specific arrangement of the elastic member, the elastic member is a compression spring or a rubber ring. The guiding post is disposed, and the elastic member is disposed on the guiding post, to help implement sliding of the heat sink relative to the housing, and the heat sink is easy to process and install.

The guiding assembly may further include a sliding slot disposed in the housing and an elastic member disposed in the sliding slot. The heat sink is slidably assembled on the sliding slot, one end of the elastic member presses against the housing, and the other end of the elastic member presses against the heat sink. During specific arrangement of the elastic member, the elastic member is a compression spring or a rubber ring.

In addition to the manners shown above, another manner that can implement a slidable connection between the heat sink and the housing may be used.

During specific arrangement of the heat sink, the heat sink includes a heat dissipation substrate thermally connected to the chip assembly and a heat dissipation structure disposed on the heat dissipation substrate. The heat dissipation substrate is slidably assembled on the guiding post, or the heat dissipation substrate is slidably assembled on the sliding slot, to implement a slidable connection between the heat dissipation substrate and the housing.

During specific arrangement of the chip assembly, the chip assembly includes a board fixed on one side inside the housing, and a chip disposed on the board and thermally connected to the heat dissipation substrate. The heat sink is disposed on the housing, to resolve a problem of excessively high stress on the board caused by an excessively large and heavy heat sink due to a limited size of the board, thereby increasing applicability of the heat sink.

In the foregoing solution, a thermally conductive material may be coated between the heat sink and the chip assembly. The thermally conductive material may be thermally conductive silicone, thermally conductive adhesive, or the like. The thermally conductive material is disposed to improve a heat conduction effect between the heat sink and the chip assembly.

A thermal pad may be further disposed between the heat sink and the chip assembly, to improve a thermal conduction effect between the heat sink and the chip assembly.

The chip apparatus further includes a panel ejector lever for pulling, to help pull the chip apparatus. During specific arrangement of the panel ejector lever, the panel ejector lever may be fixedly connected to the housing, or may be fixedly connected to the board, or may be fixedly connected to both the board and the housing.

According to a second aspect, this further provides an electronic device, where the electronic device includes any one of the foregoing chip apparatuses, to improve mechanical performance of the chip apparatus in the electronic device and prevent a chip loosening phenomenon.

DESCRIPTION OF EMBODIMENTS

To make the objectives, technical solutions, and advantages of this clearer, the following further describes this in detail with reference to the accompanying drawings.

An embodiment provides a chip apparatus, where the chip apparatus is applied to an electronic device such as a mobile phone or a computer. The chip apparatus includes a housing, a chip assembly fastened to one side inside the housing, and a heat sink disposed on an opposite side inside the housing, and the heat sink is thermally connected to the chip assembly. The following describes the chip apparatus in detail with reference to the accompanying drawings.

Figure 1:
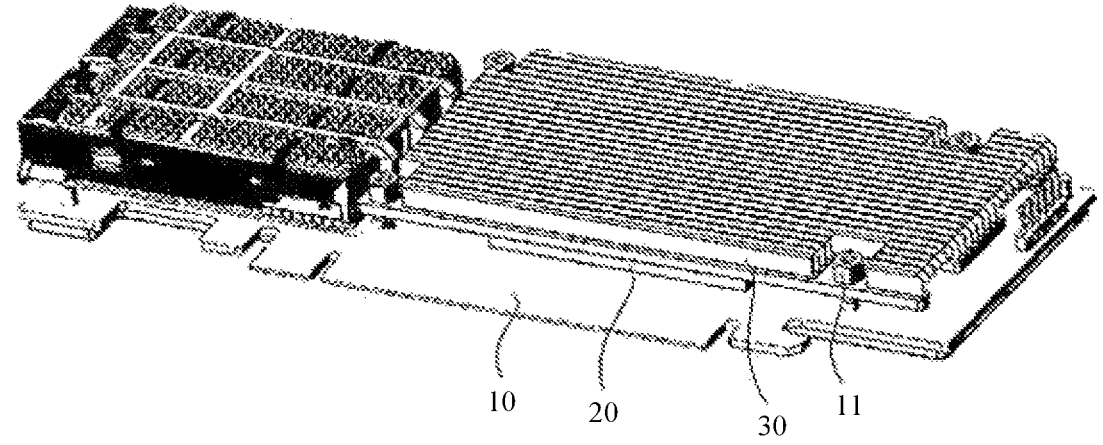
FIG. 1 is a schematic diagram of a manner of fastening a heat sink.
Figure 2:
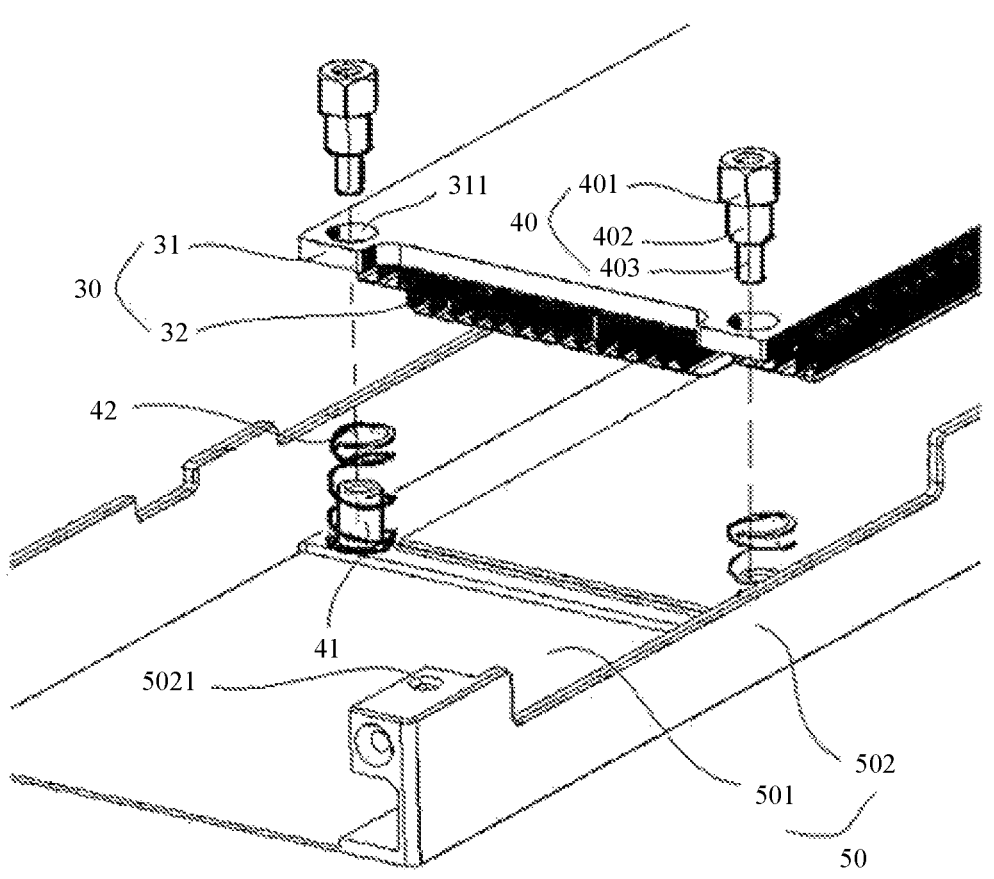
FIG. 2 is a schematic assembly diagram of a manner of fastening a heat sink according to an embodiment.
Figure 4:
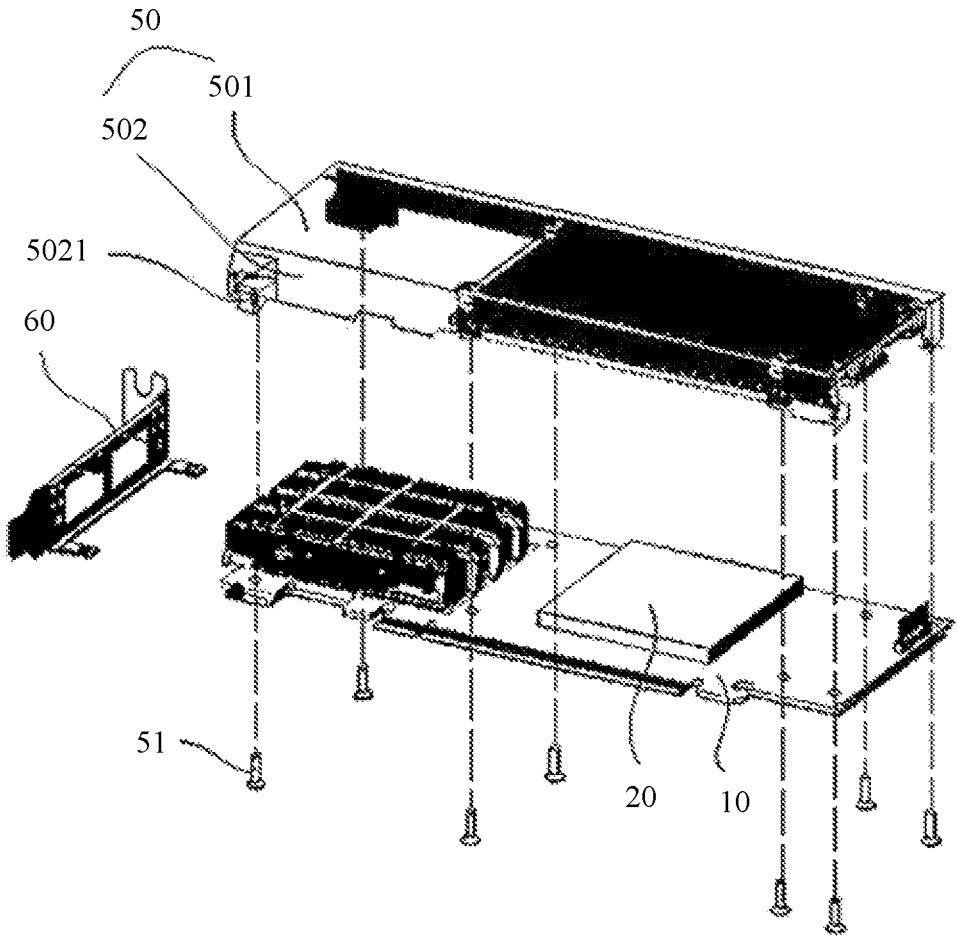
FIG. 4 is a schematic assembly diagram of components in a chip apparatus according to an embodiment.

Referring to FIG. 2 and FIG. 4, the chip apparatus provided in this embodiment includes a housing 50 and a chip assembly fastened to one side inside the housing 50.

During specific arrangement of the chip assembly, referring to FIG. 4, the chip assembly includes a board 10 fixed on one side inside the housing 50 and a chip 20 disposed on the board 10. The board 10 may be a printed circuit board. The chip 20 may be a processor chip, a memory chip, or the like. During specific arrangement of the chip 20 on the board 10, the chip 20 is fixed on the board 10 by soldering, bonding, or the like.

Figure 3:
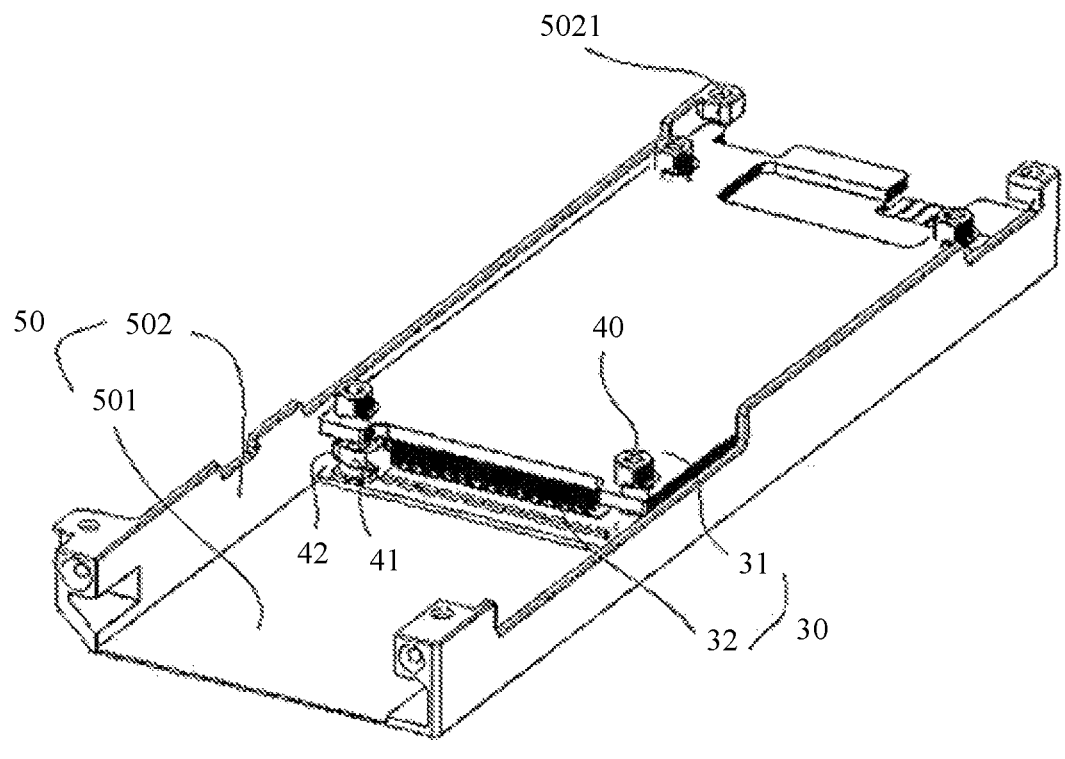
FIG. 3 is a schematic diagram of a manner of fastening a heat sink according to an embodiment.

During specific arrangement of the housing 50, referring to FIG. 2 and FIG. 3, the housing 50 may be a structure with a concave cross section, and may be an arc housing or a housing with a shape of ⊏. During specific arrangement, referring to FIG. 3, the housing 50 includes a bottom plate 501 and two side plates 502 disposed on two sides of the bottom plate 501, and the bottom plate 501 and the side plates 502 form a concave structure. The bottom plate 501 and the side plate 502 may be connected by welding, or may be disposed as an integral structure by casting. A material of the housing 50 may be a lightweight material such as an aluminum alloy or a titanium alloy, to reduce a weight of the chip apparatus. A shape of the housing 50 shown above is not unique. Moreover, the housing 50 may be another structure that can fasten the chip assembly.

During specific arrangement of the chip assembly on the housing 50, the board 10 is fastened at a concave opening of the housing 50 by screw fastening, clamping, or the like. During specific arrangement, referring to FIG. 2, FIG. 3, and FIG. 4, the board 10 is connected to the housing 50 by using a plurality of fastening screws 51, each of which is threadedly connected to a tapped hole 5021 on the side plate 502. In addition, the chip 20 is disposed on a side that is of the board 10 and that faces the bottom plate 501 of the housing 50.

Referring to FIG. 3 and FIG. 4, the chip apparatus shown in this embodiment further includes a heat sink 30 disposed on an opposite side inside the housing 50, and the heat sink

30 is thermally connected to the chip assembly. Further, the heat sink 30 is thermally connected to the chip 20.

During specific arrangement of the heat sink 30, referring to FIG. 3, the heat sink 30 shown in this embodiment includes a heat dissipation substrate 31 thermally connected to the chip assembly and a heat dissipation structure 32 disposed on the heat dissipation substrate 31. Further, referring to FIG. 4, the heat dissipation substrate 31 is thermally connected to the chip 20. During specific arrangement, the heat dissipation structure 32 and the heat dissipation substrate 31 may be disposed as an integrated structure to facilitate processing. The heat dissipation structure 32 may alternatively be fixedly connected to the heat dissipation substrate 31 by bonding, welding, or screw fastening. The heat sink 30 shown above is not unique. Moreover, the heat sink 30 may be another heat dissipation apparatus configured to dissipate heat for the chip 20 in the chip assembly.

A thermal pad for thermal conduction may be further disposed between the heat sink 30 and the chip assembly. Further, the thermal pad is disposed between the heat dissipation substrate 31 and the chip 20. Efficiency of heat conduction between the chip 20 and the heat dissipation substrate 31 is improved by using the thermal pad.

An auxiliary material for thermal conduction may be further disposed between the heat sink 30 and the chip assembly. A thermally conductive material such as thermally conductive silicone or thermal adhesive is coated between the heat sink 30 and the chip assembly shown in this embodiment. During specific arrangement, a layer of thermally conductive material such as thermally conductive silicone is coated between the heat dissipation substrate 31 and the chip 20, to improve efficiency of heat conduction between the heat sink 30 and the chip 20, and improve heat dissipation efficiency of the heat sink 30. In addition to the foregoing shown manners for improving efficiency of thermal conduction between the heat sink 30 and the chip 20, another manner that can improve efficiency of thermal conduction between the heat sink 30 and the chip 20 may be used.

During specific arrangement of the heat sink 30 on the housing 50, referring to FIG. 4, the heat sink 30 is disposed on the other side inside the housing 50 relative to the chip assembly. Further, the heat sink 30 is disposed inside the concave structure of the housing 50 (that is, between the bottom plate 501 of the housing 50 and the chip 20). The heat sink 30 is fastened on the housing 50, and when the chip apparatus is struck due to a collision, a fall, or the like, impact force generated by the heat sink 30 is transmitted to the housing 50, to mitigate impact of the heat sink 30 on the chip assembly, improve mechanical performance of the chip apparatus, and mitigate stress impact of the heat sink 30 on the chip assembly. In addition, the heat sink 30 is disposed on the housing 50, to resolve a problem of excessively high partial stress on the board 10 caused by an excessively large and heavy heat sink 30 due to a limited size of the board 10, thereby increasing applicability of the heat sink 30.

Referring to FIG. 3, the heat sink 30 shown in this embodiment is slidably connected to the housing 50, and the heat sink 30 is capable of sliding in a direction away from the chip assembly, so that when the chip apparatus is struck by a ground or another object due to a collision, fall, or the like, the heat sink 30 can slide in a direction away from the chip assembly to mitigate impact force imposed, thereby achieving energy absorption and shaking reduction effects, improving reliability of a connection between the chip 20 and the board 10, and reducing a fall-off phenomenon of the chip 20.

In a specific implementation, when the heat sink 30 is slidably connected to the housing 50, a guiding assembly is disposed in the housing 50, and the heat sink 30 is slidably connected to the housing 50 by using the guiding assembly. There is a plurality of manners for specific arrangement of the guiding assembly, including but not limited to the following manners:

Referring to FIG. 2, the guiding assembly includes a guiding post 41 fixed in the housing 50 and an elastic member 42 sleeved on the guiding post 41. The heat sink 30 is slidably assembled on the guiding post 41, and one end of the elastic member 42 presses against the housing 50, and the other end of the elastic member 42 presses against the heat sink 30. Further, one end of the elastic member 42 presses against the bottom plate 501 in the housing 50, and the other end of the elastic member 42 presses against a surface that is of the heat dissipation substrate 31 and that faces a side of the guiding post 41 on the housing 50.

During specific arrangement, the guiding post 41 may be a column structure disposed on the bottom plate 501 of the housing 50. Further, the guiding post 41 may be a cylindrical structure or a square structure. Referring to FIG. 2, the guiding post 41 shown in this embodiment is a cylindrical structure disposed on the bottom plate 501 of the housing 50. During specific arrangement of the guiding post 41 on the bottom plate 501 of the housing 50, the guiding post 41 and the bottom plate 501 of the housing 50 may be disposed as an integrated structure to facilitate processing and connection. The guiding post 41 may alternatively be fixedly connected to the bottom plate 501 of the housing 50 by welding, clamping, or the like. The guiding post 41 shown above is not unique. Moreover, another structure that has a guiding function and on which the elastic member 42 can be sleeved may be used. Referring to FIG. 2, a plurality of guiding posts 41 may be disposed on the bottom plate 501 of the housing 50, to improve reliability of the slidable connection between the heat sink 30 and the housing 50.

During specific arrangement of the elastic member 42, the elastic member 42 may be a compression spring, a rubber ring, or the like. Referring to FIG. 2, the elastic member 42 shown in this embodiment is a compression spring, and the compression spring is sleeved on the guiding post 41. It is clearly that the elastic member 42 shown above is not unique. Moreover, another structure capable of absorbing energy and reducing shaking may be used.

Further, when the heat sink 30 is slidably assembled on the guiding post 41, referring to FIG. 2 and FIG. 3, the heat sink 30 shown in this embodiment is connected to the housing 50 by using a limit screw 40. Referring to FIG. 2, the limit screw 40 includes a screw 403, and a through hole 311 penetrated by the screw 403 is disposed on the heat dissipation substrate 31. The heat dissipation substrate 31 is connected to the housing 50 by using the limit screw 40. During specific arrangement, the limit screw 40 penetrates the through hole 311 of the heat dissipation substrate 31, and is threadedly connected to the guiding post 41 on the housing 50, so that one end of the elastic member 42 presses against the bottom plate 501 of the housing 50, and the other end of the elastic member 42 presses against a surface that is of the heat dissipation substrate 31 and that faces a side of the guiding post 41, to implement a slidable connection between the heat sink 30 and the housing 50. In addition, when the limit screw 40 is tightened, the heat sink 30 and the chip 20 are in a state of "mutually extruded". Further, the heat dissipation substrate 31 and the chip 20 are mutually extruded, to improve heat dissipation efficiency of the heat sink 30.

During specific arrangement of the through hole 311, a diameter of the through hole 311 may be greater than or equal to a diameter of the guiding post 41, so that the heat dissipation substrate 31 can slide on the guiding post 41, thereby increasing a sliding range of the heat dissipation substrate 31.

During specific arrangement of the limit screw 40, referring to FIG. 2, the limit screw 40 may be a step screw, and the step screw includes two steps: a first step 401 and a second step 402. A diameter of the first step 401 is greater than the diameter of the through hole 311 on the heat dissipation substrate 31, to limit the heat dissipation substrate 31. A diameter of the second step 402 is less than or equal to the diameter of the through hole 311 on the heat dissipation substrate 31, so that the second step 402 penetrates the through hole 311, and the heat dissipation substrate 31 can slide on the second step 402. During specific arrangement of the second step 402, the diameter of the second step 402 may be equal to the diameter of the guiding post 41, to achieve smooth transition between the guiding post 41 and the second step 402, to mitigate impact on sliding of the heat dissipation substrate 31. The limit screw 40 shown above is not unique. Moreover, another screw structure that can connect the heat sink 30 and the housing 50 may be used.

Moreover, in addition to the guiding assembly shown above, another mechanism that can slidably connect the heat sink 30 and the housing 50 may be used. For example, the guiding assembly may further include a sliding slot disposed in the housing 50, and an elastic member 42 (which may be a compression spring, a rubber ring, a rubber block, or the like) disposed in the sliding slot. The heat sink 30 is slidably assembled on the sliding slot, one end of the elastic member 42 presses against the housing 50, and the other end of the elastic member 42 presses against the heat sink 30. During specific arrangement, the sliding slot may be disposed on the side plate 502 of the housing 50, and the elastic member 42 is disposed in the sliding slot by limiting, bonding, or the like. The heat sink 30 is slidably assembled in the sliding slot. Further, the heat dissipation substrate 31 is slidably assembled in the sliding slot. A slidable connection between the heat sink 30 and the housing 50 is implemented by using the disposed sliding slot and the elastic member 42 in the sliding slot.

Referring to FIG. 4, the chip apparatus shown in this embodiment further includes a panel ejector lever 60 for pulling, to help pull out of the chip apparatus. During specific arrangement of the panel ejector lever 60, the panel ejector lever 60 may be fixedly connected to the board 10 by screw fastening, clamping, or the like. The panel ejector lever 60 may be alternatively fixedly connected to the housing 50 by screw fastening, welding, clamping, or the like. The panel ejector lever 60 may be alternatively fixedly connected to both the board 10 and the housing 50 by screw fastening, welding, clamping, or the like.

According to the foregoing technical solution, the housing 50 for arrangement of the heat sink 30 is disposed, so that when the chip apparatus is struck due to a collision, a fall, or the like, impact force generated by the heat sink 30 is transmitted to the housing 50, to mitigate impact of the heat sink 30 on the chip assembly, improve mechanical performance of the chip apparatus, and reduce a probability that the chip 20 falls off the board 10.

In addition, an embodiment further provides an electronic device, where the electronic device includes any one of the foregoing chip apparatuses, so that when the electronic device is struck due to a collision, a fall, or the like, impact force generated by the heat sink 30 is transmitted to the housing 50, to mitigate impact of the heat sink 30 on the chip assembly, improve mechanical performance of the chip assembly in the chip apparatus, and reduce a probability that the chip 20 falls off the board 10.

The foregoing descriptions are merely specific implementations, but are not intended to limit the protection scope. Any variation or replacement readily figured out by a person skilled in the art within the technical scope disclosed shall fall within the protection scope. Therefore, the protection scope shall be subject to the protection scope of the claims.

What is claimed is:

1. A chip apparatus comprising:
a housing comprising an interior comprising a first side and a second side opposite to the first side;
a chip assembly fastened to the first side; and
a heat sink slidably coupled inside the interior of the housing to the second side and thermally coupled to the chip assembly, wherein the heat sink comprises:
a heat dissipation substrate thermally coupled to the chip assembly; and
a heat dissipation structure disposed on the heat dissipation substrate, wherein the heat dissipation substrate comprises through holes, and wherein the heat sink is connected to the housing by a set of limit screws penetrating the through holes.

2. The chip apparatus of claim 1, wherein the heat sink is slidable in a direction away from the chip assembly.

3. The chip apparatus of claim 2, further comprising a guiding assembly disposed in the housing, wherein the heat sink is slidably coupled to the housing using the guiding assembly.

4. The chip apparatus of claim 3, wherein the guiding assembly comprises:
a guiding post fixedly disposed in the housing, wherein the heat sink is slidably coupled to the guiding post; and
an elastic member sleeved on the guiding post, wherein the elastic member comprises:
a first end configured to press against the housing; and
a second end configured to press against the heat sink.

5. The chip apparatus of claim 3, wherein the guiding assembly comprises:
a sliding slot disposed in the housing, wherein the heat sink is slidably coupled to the sliding slot; and
an elastic member disposed in the sliding slot, wherein the elastic member comprises:
a first end configured to press against the housing; and
a second end configured to press against the heat sink.

6. The chip apparatus of claim 4, wherein the elastic member is a compression spring or a rubber ring.

7. The chip apparatus of claim 5, wherein the elastic member is a compression spring or a rubber ring.

8. The chip apparatus of claim 4,
wherein the heat dissipation substrate is slidably coupled to the guiding post.

9. The chip apparatus of claim 5, wherein the heat dissipation substrate is slidably coupled to the sliding slot.

10. The chip apparatus of claim 8, further comprising a chip thermally coupled to the heat dissipation substrate, wherein the chip assembly comprises a board fixed on the first side, and wherein the chip is disposed on the board.

11. The chip apparatus of claim 1, further comprising a thermally conductive material between the heat sink and the chip assembly.

12. An electronic device comprising:
a chip apparatus comprising:
a housing comprising an interior comprising a first side and a second side opposite to the first side;
a chip assembly fastened to the first side; and
a heat sink slidably coupled inside the interior of the housing to the second side and thermally coupled to the chip assembly, wherein the heat sink comprises:
a heat dissipation substrate thermally coupled to the chip assembly; and
a heat dissipation structure disposed on the heat dissipation substrate, wherein the heat dissipation substrate comprises through holes, and wherein the heat sink is connected to the housing by a set of limit screws penetrating the through holes.

13. The electronic device of claim 12, wherein the heat sink is slidable in a direction away from the chip assembly.

14. The electronic device of claim 13, further comprising a guiding assembly disposed in the housing, wherein the heat sink is slidably coupled to the housing using the guiding assembly.

15. The electronic device of claim 14, wherein the guiding assembly comprises:
a guiding post fixedly disposed in the housing, wherein the heat sink is slidably coupled to the guiding post; and
an elastic member sleeved on the guiding post, wherein the elastic member comprises:
a first end configured to press against the housing; and
a second end configured to press against the heat sink.

16. The electronic device of claim 14, wherein the guiding assembly comprises:
a sliding slot disposed in the housing, wherein the heat sink is slidably coupled to the sliding slot; and
an elastic member disposed in the sliding slot, wherein the elastic member comprises:
a first end configured to press against the housing; and
a second end configured to press against the heat sink.

17. The electronic device of claim 15, wherein the elastic member is a compression spring or a rubber ring.

18. The electronic device of claim 15, wherein the heat dissipation substrate is slidably coupled to either the guiding post or a sliding slot of the guiding assembly.

19. The electronic device of claim 18, further comprising a chip thermally coupled to the heat dissipation substrate, wherein the chip assembly comprises a board fixed on the first side, and wherein the chip is disposed on the board.

20. The electronic device of claim 12, further comprising a thermally conductive material between the heat sink and the chip assembly.

* * * * *